(12) United States Patent
Wu

(10) Patent No.: US 9,054,076 B2
(45) Date of Patent: Jun. 9, 2015

(54) HEAT-DISSIPATING ASSEMBLY AND METHOD FOR MANUFACTURING THE SAME

(75) Inventor: Chun-Ming Wu, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 477 days.

(21) Appl. No.: 13/409,113

(22) Filed: Mar. 1, 2012

(65) Prior Publication Data

US 2013/0228311 A1 Sep. 5, 2013

(51) Int. Cl.
| | |
|---|---|
| *B21D 53/02* | (2006.01) |
| *H01L 23/427* | (2006.01) |
| *F28D 15/02* | (2006.01) |
| *B21D 53/06* | (2006.01) |
| *B23P 15/26* | (2006.01) |

(52) U.S. Cl.
CPC ........... *H01L 23/427* (2013.01); *Y10T 29/4935* (2015.01); *B21D 53/06* (2013.01); *B23P 15/26* (2013.01); *B21D 53/02* (2013.01); *F28D 15/0275* (2013.01); *H01L 2924/0002* (2013.01)

(58) Field of Classification Search
CPC ........ B21D 53/02; B21D 53/06; B21D 39/06; B23P 15/26; B23P 2700/09; F28F 2275/02

USPC .......... 29/890.03, 890.032, 890.04, 890.043, 29/890.045; 165/80.1, 80.2–80.4, 76, 79

See application file for complete search history.

(56) References Cited

U.S. PATENT DOCUMENTS

| | | | | |
|---|---|---|---|---|
| 2004/0052051 | A1* | 3/2004 | Malone | 361/700 |
| 2007/0151711 | A1* | 7/2007 | Chen et al. | 165/104.33 |
| 2008/0047693 | A1* | 2/2008 | Chen | 165/104.33 |
| 2011/0120668 | A1* | 5/2011 | Li et al. | 165/67 |
| 2011/0120683 | A1* | 5/2011 | Kappes et al. | 165/157 |

* cited by examiner

*Primary Examiner* — Christopher Besler
(74) *Attorney, Agent, or Firm* — C. G. Mersereau; Nikolai & Mersereau, P.A.

(57) ABSTRACT

The present invention provides a heat-dissipating assembly and a method for manufacturing the same. The heat-dissipating assembly includes a base, at least one heat pipe, and a combining unit. The base is provided with an accommodating trough and at least one through-hole. The accommodating trough has at least one receiving hole penetrating the base. One end of the heat pipe is disposed through the through-hole on one side of the base into the receiving hole. The combining unit covers the accommodating trough and one end of the heat pipe. By this arrangement, the efficiency in assembly is increased and the working hours are decreased. Further, the production cost is reduced.

3 Claims, 5 Drawing Sheets

HEAT-DISSIPATING ASSEMBLY AND METHOD FOR MANUFACTURING THE SAME

BACKGROUND OF THE INVENTION

1. Field of the Invention

The present invention relates to a heat-dissipating assembly and a method for manufacturing the same, and in particular to a heat-dissipating assembly which has an increased efficiency in assembly and decreased working hours to thereby reduce production cost and a method for manufacturing the same.

2. Description of Prior Art

Current heat-dissipating device and heat-dissipating module are often constituted by combining a plurality of heat-dissipating elements of the same kind or different kinds. The suitable heat-dissipating elements include heat pipes, heat sinks, heat-dissipating bases or the like. These heat-dissipating elements are combined with one another by welding. However, if the heat-dissipating elements are made of aluminum and the welding process is to be performed, not only an auxiliary welding step but also a specific welding step are needed, which makes the manufacturing process more complicated and increases the production cost. Further, the welding process will pollute our environment.

Thus, the manufacturers in this field propose to combine the heat-dissipating elements by fixing elements such as screws. However, only some of the heat-dissipating elements can be fixed by screws, such as heat-dissipating fin set and heat-dissipating base. As for the heat pipes, they cannot be directly fixed by screws.

On the other hand, in prior art, the heat-dissipating base is provided with a hole or groove and then the heat pipe is disposed through the hole or groove of the heat-dissipating base, thereby combining the heat pipe with the heat-dissipating base. Although such a solution can solve the aforesaid problems associated with the welding process and the fixation by screws, the heat pipe does not conduct the heat directly, but indirectly conducts the heat via the heat-dissipating base. Moreover, gaps exist between the heat pipe and the heat-dissipating base to generate thermal resistance. As a result, the heat-conducting efficiency of the whole structure is insufficient.

Therefore, the conventional solution of fixing the heat-dissipating elements are not suitable for combining all kinds of heat-dissipating elements, and it has the following problems: (i) increased cost, (ii) more working hours, (iii) larger weight, and (iv) low yield.

SUMMARY OF THE INVENTION

In order to solve the above problems, an objective of the present invention is to provide a heat-dissipating assembly which has an increased efficiency in assembly and decreased working hours.

Another objective of the present invention is to provide a heat-dissipating assembly having a reduced production cost.

A further objective of the present invention is to provide a method for manufacturing a heat-dissipating assembly having an increased efficiency in assembly and decreased working hours.

A still further objective of the present invention is to provide a method for manufacturing a heat-dissipating assembly having a reduced production cost.

In order to achieve the above objectives, the present invention provides a heat-dissipating assembly including a base, at least one heat pipe and a combining unit. The base is provided with an accommodating trough and at least one through-hole. The accommodating trough is provided on one side of the base. The interior of the accommodating trough has at least one receiving hole extending from the interior of the accommodating trough to the other side of the base. The through-hole is provided on one side of the base and in communication with the accommodating trough. One end of the heat pipe is disposed through the through-hole into the receiving hole. The combining unit covers the accommodating trough and has at least one trough. The trough is provided on one side of the combining unit facing the accommodating trough for allowing the heat pipe to be disposed therein. According to the present invention, the heat pipe is received in the accommodating trough of the base, and the combining unit covers the accommodating trough to form one body. Thus, the efficiency in assembly is increased and the working hours are decreased. Further, the production cost is reduced.

The present invention further provides a method for manufacturing a heat-dissipating assembly, including steps of: providing a base formed with an accommodating trough, at least one heat pipe and a combining unit; disposing the heat pipe into the accommodating trough, covering the combining unit onto the accommodating trough and the heat pipe; disposing the combination of the base, the heat pipe and the combining unit into a mold having a molding cavity; pouring a molten plastic material in one side of the combining unit having at least one penetration hole by a machining step; and firmly combining the heat pipe, the base and the combining unit when the molten plastic material is cooled and harden.

By the method of the present invention, the efficiency in assembly is increased and the working hours are decreased. Further, the production cost is reduced.

DETAILED DESCRIPTION OF THE INVENTION

Figure 1:
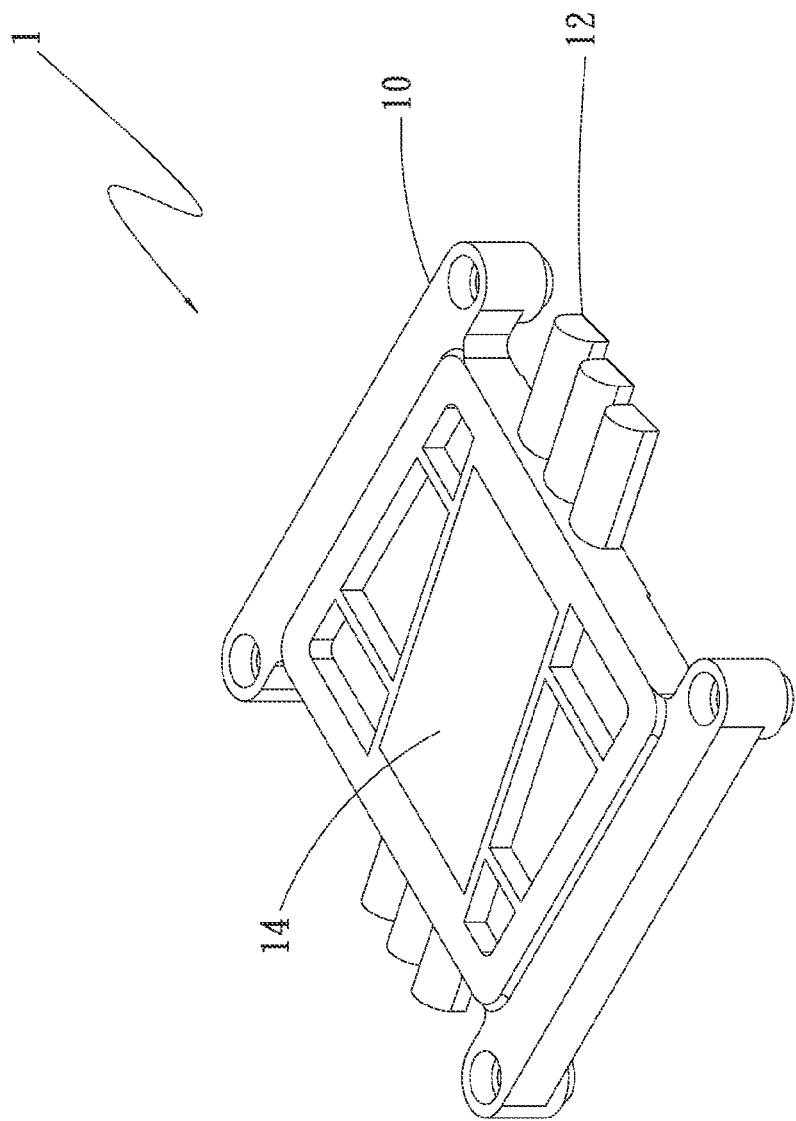
FIG. 1 is an assembled perspective view showing a first embodiment of the present invention.
Figure 2:
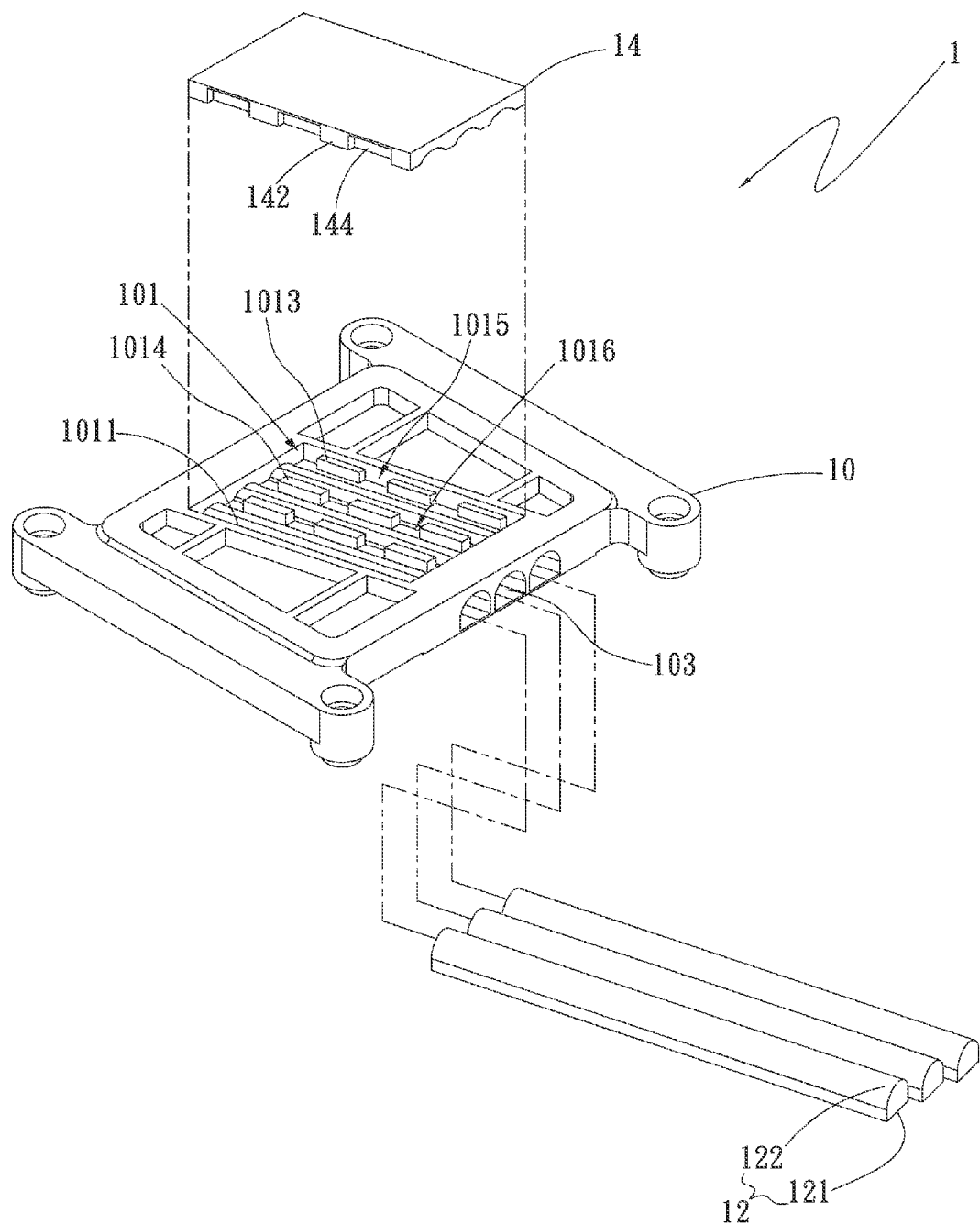
FIG. 2 is an exploded perspective view showing the first embodiment of the present invention.
Figure 3:
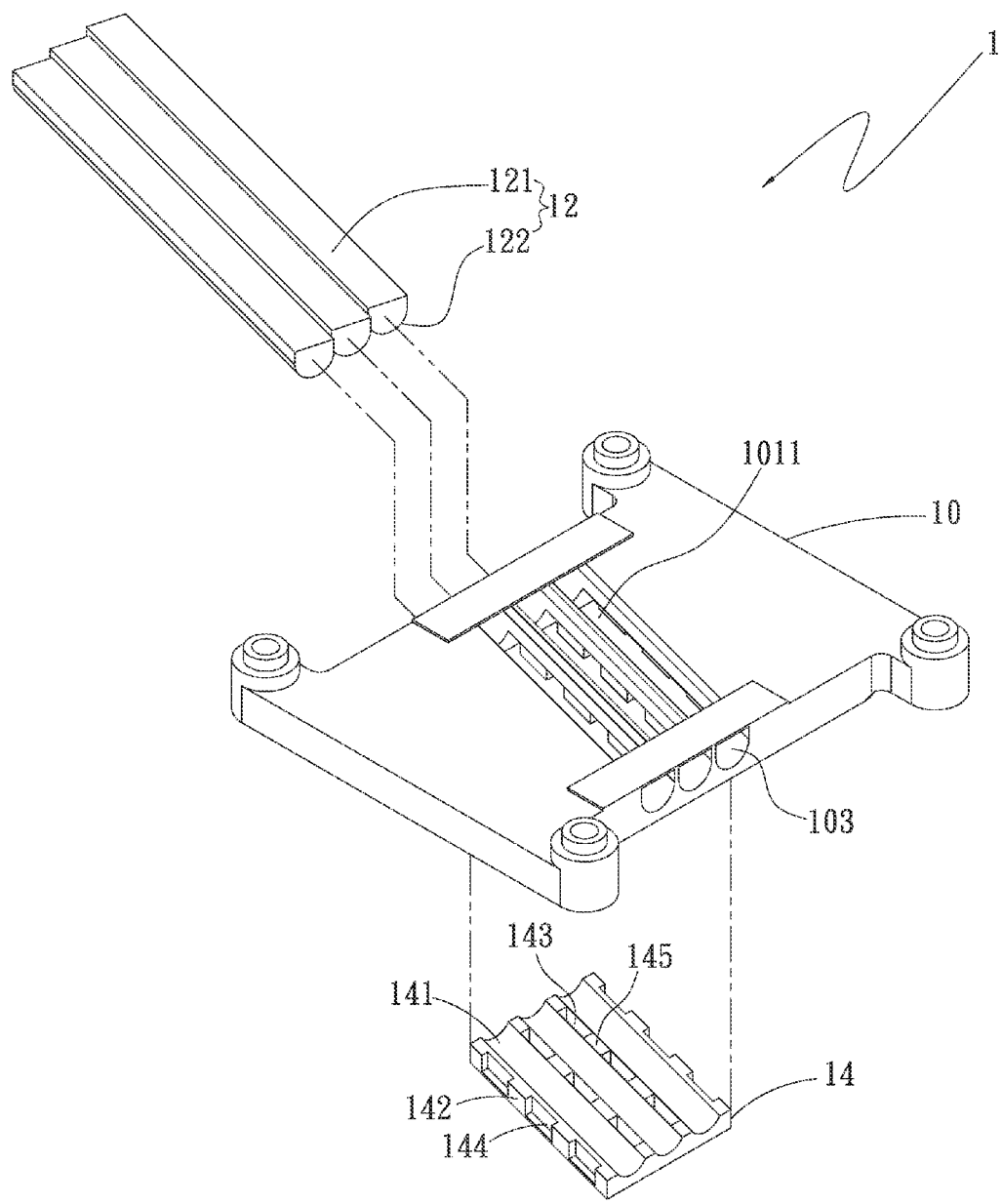
FIG. 3 is another exploded perspective view showing the first embodiment of the present invention.

The above objectives and structural and functional features of the present invention will be described in more detail with reference to preferred embodiment thereof shown in the accompanying drawings The present invention provides a heat-dissipating assembly and a method for manufacturing the same. Please refer to FIGS. 1, 2, and 3 showing the first embodiment of the present invention. The heat-dissipating assembly 1 includes a base 10, at least one heat pipe 12, and a combining unit 14. The base 10 is provided with an accommodating trough 101 and at least one through-hole 103. The accommodating trough 101 is provided on one side of the base 10. The interior of the accommodating trough 101 has at least one receiving hole 1011 extending from the interior of the accommodating trough 101 to the other side of the base 10. That is, the receiving hole 1011 of the accommodating trough 101 extends from one side of the base 10 to the other side of the base 10. In the present embodiment, three receiving holes 1011 are provided for example, but it is not limited thereto. In practice, the number of the receiving holes 1011 corresponds to that of the heat pipes 12. The base 10 and the combining unit 14 are made of non-metallic materials such as plastic materials.

In the present embodiment, three through-holes 103 are provided on the each side of the base 10. Each receiving hole 1011 is positioned to correspond to three through-holes 103. As shown in FIG. 2, one of the through-holes 103 is provided on one side of the base 10, and the other through-hole 103 is provided on the other side of the base 10 and in communication with the aforesaid through-hole 103 and the accommodating trough 101.

The accommodating trough 101 is further provided with at least one first protrusion 1013 and at least one second protrusion 1014. The first protrusion 1013 is provided on an inner surface of the accommodating trough 101. That is, the first protrusion 1013 protrudes from the inner surface of the accommodating trough 101 toward the center of the accommodating trough 101. A first receiving space 1015 is defined between adjacent two first protrusions 1013. Each second protrusion 1014 protrudes from the receiving hole 1011, so that a second receiving space 1016 is defined between adjacent two second protrusions 1014. The first receiving space 1015 and the second receiving space 1016 are in communication with the accommodating trough 101 and the receiving hole 1011.

Figure 1A:
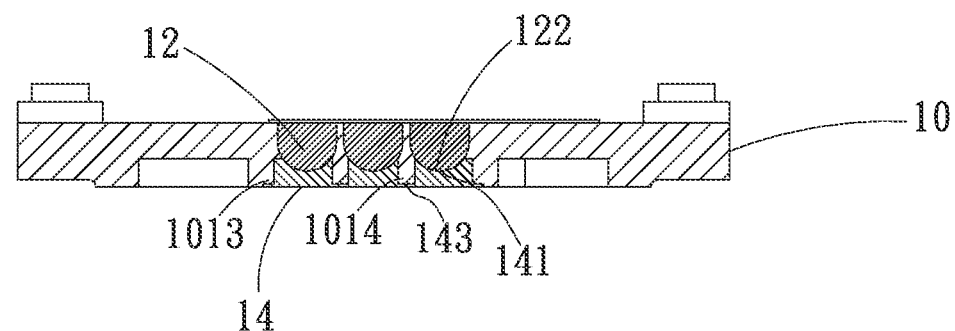
FIG. 1A is a partially cross-sectional view of FIG. 1.
Figure 1B:
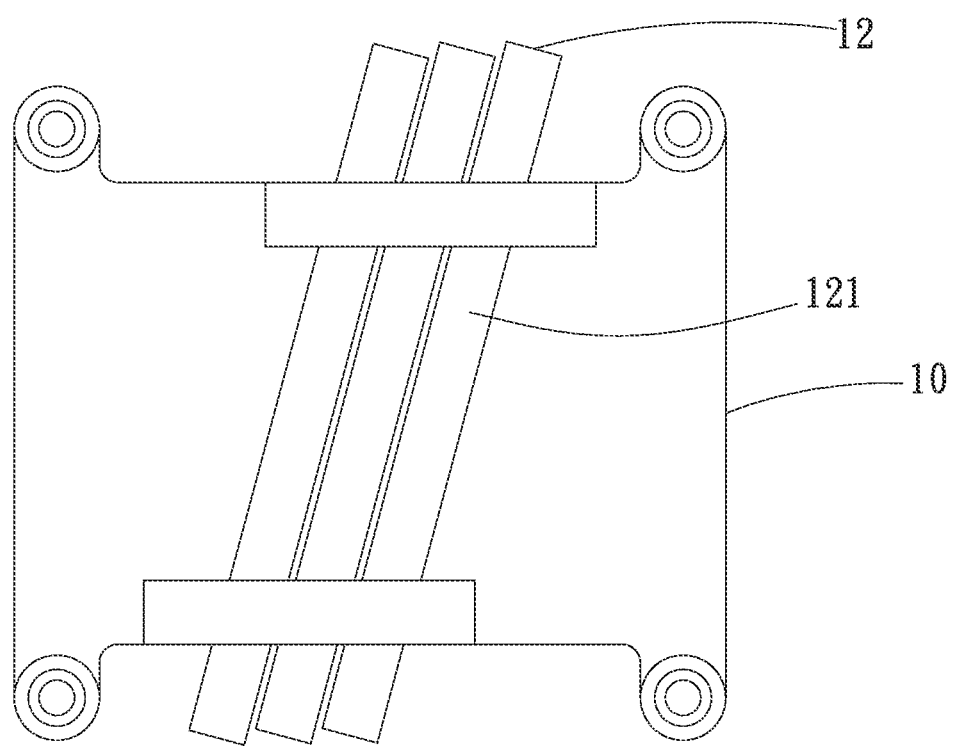
FIG. 1B is a bottom view of FIG. 1.

Please refer to FIGS. 2 and 3 together with FIGS. 1A and 1B. One end of the heat pipe 12 is disposed through the through-hole 103 into the receiving hole 1011 and penetrates the base 10 via the other through-hole 103. In the present embodiment, the number of the heat pipes 12 corresponds to that of the receiving holes 1011, so that three heat pipes 12 are used as an example. Each heat pipe 12 has a planar surface 121 and a non-planar surface 122 opposite to the planar surface 121. The planar surface 121 is in flush with the other side of the base 10 and brought into thermal contact with a heat-generating element (such as a central processor, a graphic chip, a south/north bridge chip or other processing units, not shown in the figures) for absorbing the heat generated by the heat-generating element directly. In this way, the heat generated by the heat-generating element can be rapidly conducted to a heat-dissipating unit (such as a heat sink having heat-dissipating fins or a heat-dissipating fin set, not shown in the figures) connected to the other end of the heat pipe 12, thereby dissipating the heat to the outside. The non-planar surface 122 is received in the trough 141.

The combining unit 14 covers the accommodating trough 101 and has at least one trough 141, at least one male insertion portion 142 and at least one female insertion portion 143. The trough 141 is provided on one side of the combining unit 14 facing the accommodating trough 101 for allowing the heat pipe 12 to be disposed therein. In the present embodiment, there are three troughs 141. That is, the number of the troughs 141 corresponds to that of the heat pipes 12.

The male insertion portion 142 is provided on the two opposite sides of the combining unit 14 to be inserted into the first receiving space 1015. The female insertion portions 143 are provided between each trough 141 to be inserted by the second protrusions 1014.

Please refer to FIGS. 2 and 3 together with FIGS. 1 and 1A. A third receiving space 144 is defined between adjacent two male portions 142. A flat portion 145 is formed between adjacent two female portions 143. The third receiving space 144 is inserted by the first protrusion 1013, and the flat portion 145 is inserted into the second receiving space 1016.

In the present embodiment, the male portions 142 and the female portions 143 are provided on outer surfaces of the combining unit 14 and between adjacent two troughs 141 at equal intervals, but their positions are not limited thereto. In practice, a user can change the intervals between the male portions 142 and the female portions 143 into unequal or both based on the desired strength of combination between the combining unit 14 and the accommodating trough 101. Accordingly, the first protrusion 1013, the second protrusion 1014, the first receiving space 1015, and the second receiving space 1016 have to be changed in a way corresponding to the third receiving space 144, the female portion 143, the male portion 142 and the flat portion 145, whereby the combining unit 14, the heat pipe 12, and the base 10 can be firmly combined with one another to form one body.

According to the present invention, the heat pipe 12 is received in receiving hole 1011 of the accommodating trough 101 of the base 10, and the combining unit 14 tightly covers the accommodating trough 101 and the heat pipe 12, so that the heat pipe 12, the base 10 and the combining unit 14 can be firmly combined with one another to form one body. Thus, the efficiency in assembly is increased and the working hours are decreased. Further, the production cost is reduced.

Figure 4:
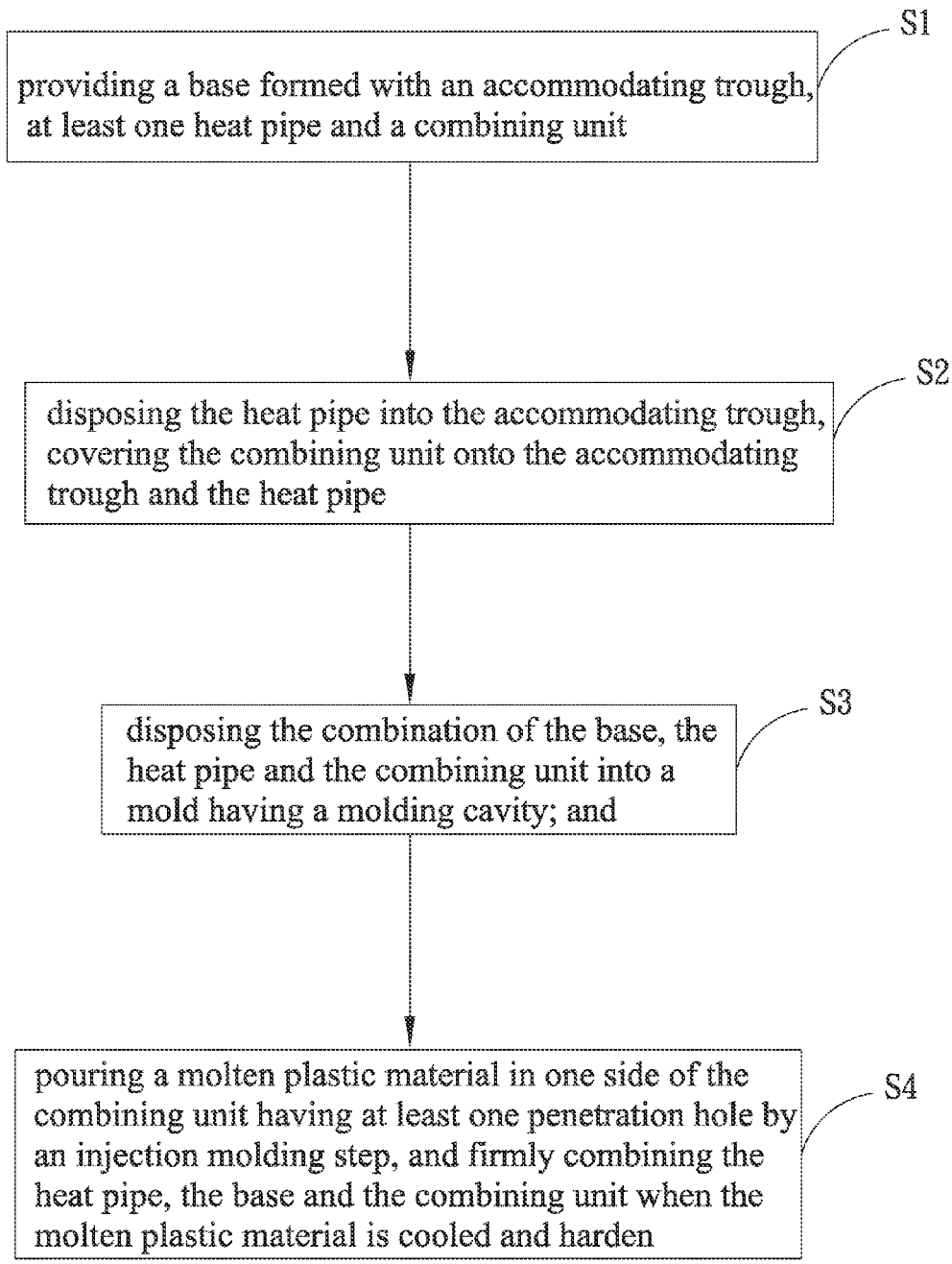
FIG. 4 is a flow chart showing a second embodiment of the present invention.

Please refer to FIG. 4, which is a flow chart showing the second embodiment of the present invention. Please also see FIGS. 1 to 3. The second embodiment provides a method for manufacturing the heat-dissipating assembly of the first embodiment of the present invention. The inventive method includes the following steps.

(S1) providing a base formed with an accommodating trough, at least one heat pipe and a combining unit.

A base 10 formed with an accommodating trough 10, at least one heat pipe 12, and a combining unit 14 are provided. The base 10 and the combining unit 14 are made of non-metallic materials such as plastic materials.

(S2) disposing the heat pipe into the accommodating trough, covering the combining unit onto the accommodating trough and the heat pipe.

One end of the heat pipe 12 is disposed in the receiving hole 1011 of the corresponding accommodating trough 101. Then, the combining unit 14 covers the accommodating trough 101. The end of the heat pipe 12 received in the receiving hole 1011 is received in the trough 141 of the combining unit 14, so that one end of the heat pipe 12 can be assembled with the base 10 and the combining unit 14.

(S3) disposing the combination of the base, the heat pipe and the combining unit into a mold having a molding cavity.

The combination of the base 10, the heat pipe 12 and the combining unit 14 is put into a mold (not shown) having a molding cavity.

(S4) pouring a molten plastic material in one side of the combining unit having at least one penetration hole by an injection molding step; and firmly combining the heat pipe, the base and the combining unit when the molten plastic material is cooled and harden.

The molten plastic material is injected into one side of the combining unit 14 opposite to the accommodating trough 101 and having at least one penetration hole (not shown). The penetration hole is in communication with the female portions 143 of the combining unit 14. After the molten plastic material is cooled and hardened, the heat pipe 12, the base 10 and the combining unit 14 can be firmly combined with one another to form one body.

By the method of the present invention, the efficiency in assembly is increased and the working hours are decreased. Further, the production cost is reduced.

According to the above, the present invention has the following advantageous features over prior art: (I) reduced production cost, (II) decreased working hours, (III) smaller weight, and (IV) higher yield.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A method for manufacturing a heat-dissipating assembly, including steps of:
   providing a base having a top side and a bottom side and formed with an accommodating trough and a plurality of through-holes, at least one heat pipe and a combining unit, the accommodating trough provided on one of the top side and the bottom side of the base and having at least one receiving hole extending from the accommodating trough to penetrate the base, each of the plurality of through-holes being provided on at least one of a front and a back side of the base and in communication with the accommodating trough, the combining unit having at least one penetration hole;
   disposing one end of the heat pipe through one of the through-holes on the front side, one of the through-holes on the back side of the base, and into the accommodating trough, covering the combining unit toward the top side of the base and onto the accommodating trough and the heat pipe;
   disposing a combination of the base, the heat pipe and the combining unit into a mold having a molding cavity; and
   pouring a molten plastic material in one side of the combining unit using the at least one penetration hole by an injection molding step, and firmly combining the heat pipe, the base and the combining unit when the molten plastic material is cooled and hardened;
   wherein the at least one heat pipe does not penetrate the top and bottom sides of the base and the combining unit.

2. The method according to claim 1, wherein the base and the combining unit are made of a non-metallic material.

3. The method according to claim 2, wherein the non-metallic material is a plastic material.

* * * * *